United States Patent
Cho et al.

(10) Patent No.: US 8,830,743 B2
(45) Date of Patent: Sep. 9, 2014

(54) METHOD OF OPERATING MEMORY CONTROLLER, MEMORY CONTROLLER, MEMORY DEVICE AND MEMORY SYSTEM

(75) Inventors: Kyoung-Lae Cho, Gyeonggi-do (KR); Jun-Jin Kong, Gyeonggi-do (KR); Jae-Hong Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 167 days.

(21) Appl. No.: 13/445,048

(22) Filed: Apr. 12, 2012

(65) Prior Publication Data

US 2012/0265927 A1    Oct. 18, 2012

(30) Foreign Application Priority Data

Apr. 15, 2011   (KR) .................... 10-2011-0035353

(51) Int. Cl.
| | | |
|---|---|---|
| G11C 16/04 | (2006.01) | |
| G11C 29/56 | (2006.01) | |
| G11C 11/56 | (2006.01) | |
| G11C 16/34 | (2006.01) | |
| G11C 29/12 | (2006.01) | |
| G11C 29/44 | (2006.01) | |

(52) U.S. Cl.
CPC .... G11C 11/5642 (2013.01); *G11C 2029/1208* (2013.01); G11C 29/56008 (2013.01); G11C 16/3418 (2013.01); *G11C 2029/4402* (2013.01); *G11C 29/44* (2013.01)

USPC ...................................................... 365/185.02

(58) Field of Classification Search
USPC ...................................................... 365/185.03
See application file for complete search history.

(56) References Cited

U.S. PATENT DOCUMENTS

| | | | | |
|---|---|---|---|---|
| 7,477,547 B2 * | 1/2009 | Lin | .......................... | 365/185.09 |
| 8,254,170 B2 * | 8/2012 | Eli et al. | ................... | 365/185.09 |
| 2010/0020616 A1 * | 1/2010 | Auclair et al. | ........... | 365/185.18 |
| 2013/0128666 A1 * | 5/2013 | Avila et al. | ............... | 365/185.11 |

FOREIGN PATENT DOCUMENTS

| | | |
|---|---|---|
| JP | 2005-182909 A | 7/2005 |
| JP | 2010160816 A | 7/2010 |

* cited by examiner

*Primary Examiner* — Hoai V Ho
*Assistant Examiner* — Min Huang
(74) *Attorney, Agent, or Firm* — Harness, Dickey & Pierce, P.L.C.

(57) ABSTRACT

A method of operating a memory controller, a memory controller, a memory device and a memory system are provided. The method includes reading first data from a nonvolatile memory device using a first read voltage, the first data includes a uncorrectable error bit, reading second data from a nonvolatile memory device using a second read voltage different from the first read voltage, the second data includes an correctable error bit, and reprogramming the nonvolatile memory device according to the comparison result of the first read voltage and the second read voltage.

9 Claims, 15 Drawing Sheets

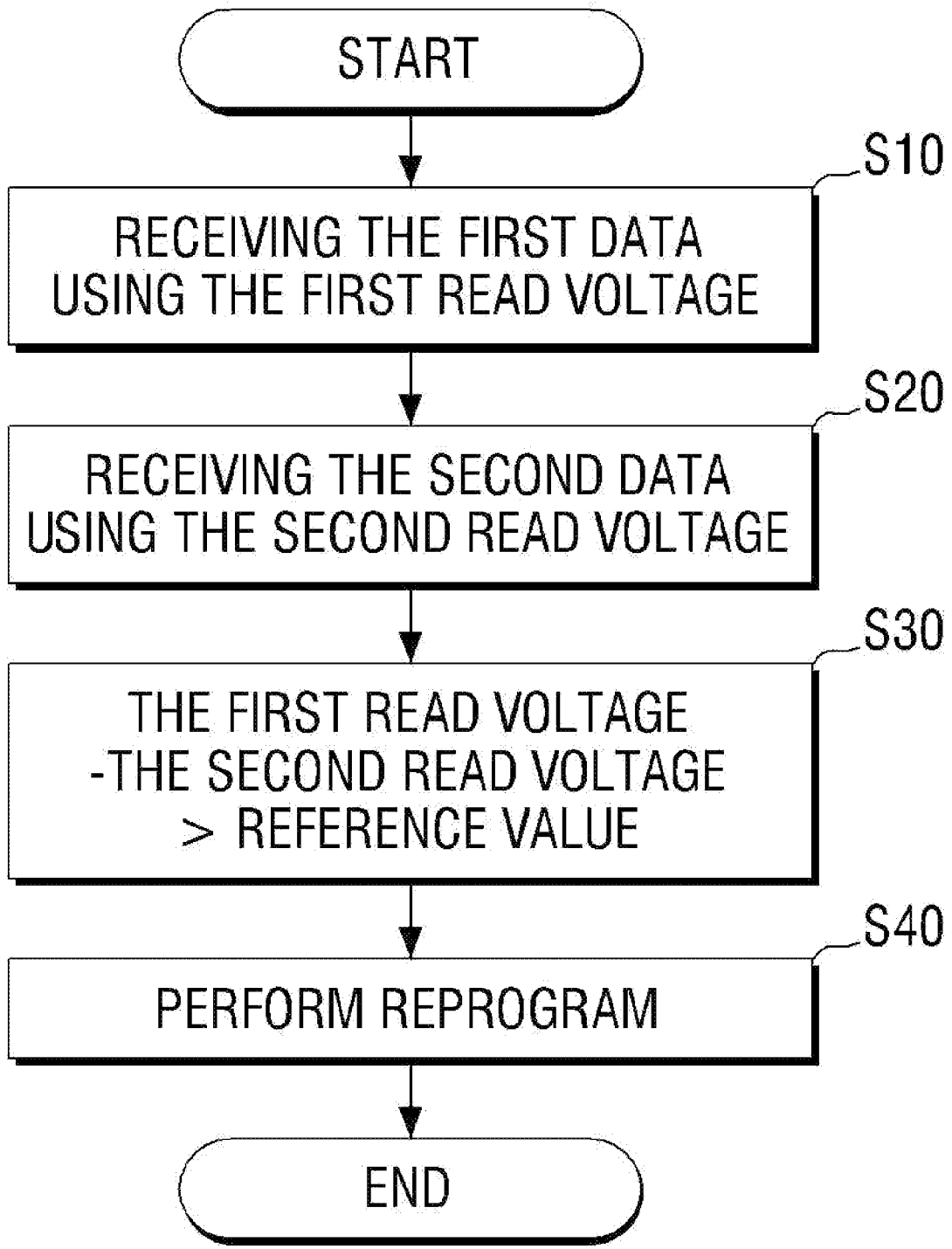

METHOD OF OPERATING MEMORY CONTROLLER, MEMORY CONTROLLER, MEMORY DEVICE AND MEMORY SYSTEM

CROSS-REFERENCE TO RELATED APPLICATION

This application claims priority under 35 U.S.C. §119 to Korean Patent Application No. 10-2011-0035353 filed on Apr. 15, 2011 in the Korean Intellectual Property Office (KIPO), the entire contents of which are incorporated herein by reference.

BACKGROUND

1. Field

Example embodiments relate to a method of operating a memory controller, the memory controller, a memory device and a memory system.

2. Description of the Related Art

A memory device is classified into a volatile memory device and a non-volatile memory device. When power is interrupted, data is not retained in the volatile memory device. However, data is retained in the nonvolatile memory device even if power is interrupted.

Examples of the nonvolatile memory device may include a read only memory (ROM), an electrically erasable programmable read-only memory (EEPROM), and so on.

The configuration and operation of a flash memory device known as flash EEPROM are different from those of the conventional EEPROM. In the flash memory device, an electric erase operation is carried on a block-by-block basis and a program operation is carried on a bit-by-bit basis.

Threshold voltages of a plurality of programmed memory cells of a flash memory device may vary due to various factors, such as floating gate coupling, charge loss over time, or the like.

Threshold voltage variations of multiple memory cells may deteriorate reliability of read data.

SUMMARY

According to at least one example embodiment, a method of operating a memory controller which can improve reliability of read data is provided.

According to at least one example embodiment, a memory controller which can improve reliability of read data is provided.

According to at least one example embodiment, a memory device which can improve reliability of read data is provided.

According to at least one example embodiment, a memory system which can improve reliability of read data is provided.

According to at least one example embodiment, a method of operating a memory controller includes reading, as first data, data stored in a nonvolatile memory device using a first read voltage, the first data including a uncorrectable error bit, reading, as second data, data stored in the nonvolatile memory device using a second read voltage different from the first read voltage, the second data including an correctable error bit, and reprogramming the stored data in the nonvolatile memory device based on a comparison result of the first read voltage and the second read voltage.

According to at least one example embodiment, a method of operating a memory controller includes receiving first data from a cell array of a nonvolatile memory device by reading data stored in the cell array using a first read voltage and correcting an error bit, providing information for forming a second read voltage smaller than the first read voltage to the nonvolatile memory device, when the first data includes an uncorrectable error bit; receiving correctable second data from the cell array of the nonvolatile memory device by reading the stored data using a second read voltage different from the first read voltage, and reprogramming the data stored in the cell array of the nonvolatile memory device according to the comparison result of the first read voltage and the second read voltage.

According to at least one example embodiment, a method of operating a memory controller may include determining a comparison result based on a first read voltage and a second read voltage, the first and second read voltages being a read voltages that, when used to read data stored in a nonvolatile memory device, produce read data including an uncorrectable error bit and read data including a correctable error, respectively; and reprogramming the data stored in a nonvolatile memory device based on the comparison result.

According to at least one example embodiment, there is provided a memory controller including a central processor unit (CPU) that supplies information on a second read voltage different from a first read voltage to a nonvolatile memory device, a memory that stores first data read using the first read voltage and second data read using the second read voltage corresponding the information on the second read voltage, and an error correction code (ECC) decoder that corrects an error bit using the first data and the second data, wherein when the ECC decoder cannot correct the error bit of the first data and can correct the error bit of the second data, the CPU determines to reprogram the nonvolatile memory according to the comparison result of the first read voltage and the second read voltage.

According to at least one example embodiment, there is provided a memory device including a micro central processor unit (micro CPU), a cell array that stores data and includes a plurality of pages and a plurality of blocks, and a voltage generator that generates a first read voltage and a second read voltage that are applied to a first page corresponding to the same address and are different from each other under the control of the micro CPU, wherein the micro CPU compares the first read voltage with the second read voltage and reprograms the cell array according to the comparison result.

According to at least one example embodiment, there is provided a memory system including a nonvolatile memory that stores data and includes a plurality of pages and a plurality of blocks, a controller that controls the nonvolatile memory, wherein the controller includes a memory that receives and stores first data read from the nonvolatile memory using a first read voltage, second data read from the nonvolatile memory using a second read voltage, information on the first read voltage and information on the second read voltage, an error correction code (ECC) decoder that corrects an error bit using the first data and the second data, and a central processor unit (CPU) that compares the first read voltage and the second read voltage and determines to reprogram the nonvolatile memory according to the comparison result of the first read voltage and the second read voltage, when the error bit of the first data cannot be corrected and the error bit of the second data can be corrected.

Example embodiments are directed to a method of operating a memory controller, the memory controller, a memory device and a memory system. According to example embodiments, the reliability of a multi-bit nonvolatile memory can be improved.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 3 is a flowchart for explaining a method of operating a nonvolatile memory device according to at least one example embodiment;

DETAILED DESCRIPTION OF THE EMBODIMENTS

Figure 1:
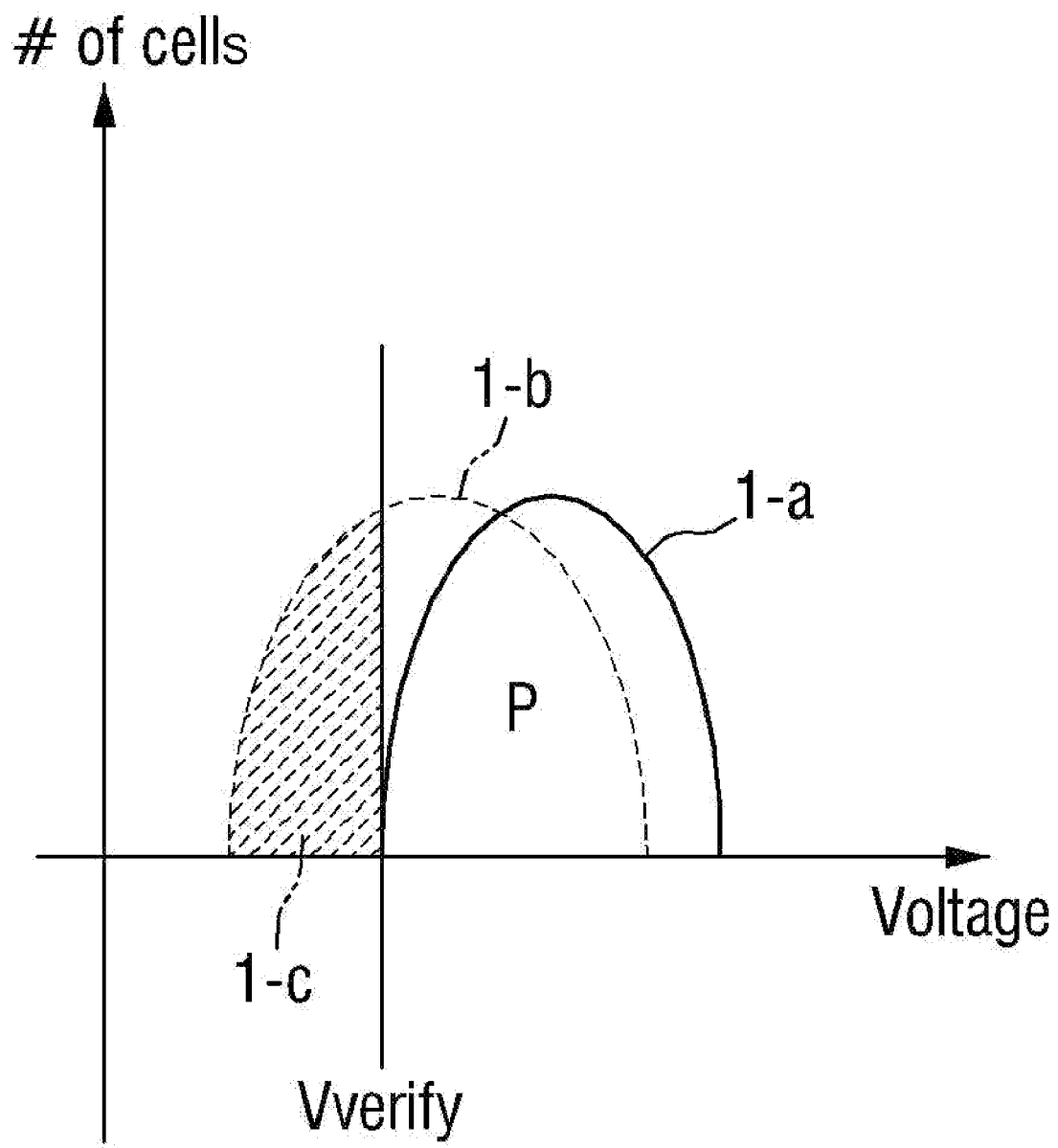
FIG. 1 illustrates a charge loss phenomenon of a single level cell (SLC) flash memory device.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 illustrates a charge loss phenomenon of a single level cell (SLC) flash memory device.

Referring to FIG. 1, a charge loss phenomenon means that some of electric charges among electrons trapped in a storage layer of a flash memory device (e.g., a floating gate) or a tunnel oxide layer escape from the storage layer or the tunnel oxide layer according to the passage of time. In addition, if the number of program and erase operations repeated increases, the tunnel oxide layer may deteriorate and charge loss may occur more severely.

In detail, the x axis indicates voltages, and the y axis indicates the number of memory cells. A first program state distribution (1-$a$) is a program state distribution immediately after a program operation (that is, a state in which no charge loss occurs), and a second program state distribution (1-$b$) is a program state distribution immediately after a charge loss phenomenon occurred. That is to say, as the charge loss occurs, the first program state distribution (1-$a$) is shifted to the second program state distribution (1-$b$).

Thus, the first program state distribution (1-$a$) is positioned on the right side of a verify voltage Vverify, while a partial section (1-$c$) of the second program state distribution (1-$b$) is positioned on the left side of the verify voltage Vverify. If the number of nonvolatile memory cells corresponding to the partial section (1-$c$) of the second program state distribution (1-$b$) increases, the nonvolatile memory cells corresponding to the partial section (1-$c$) cannot be corrected using an error correction code (ECC).

Figure 2:
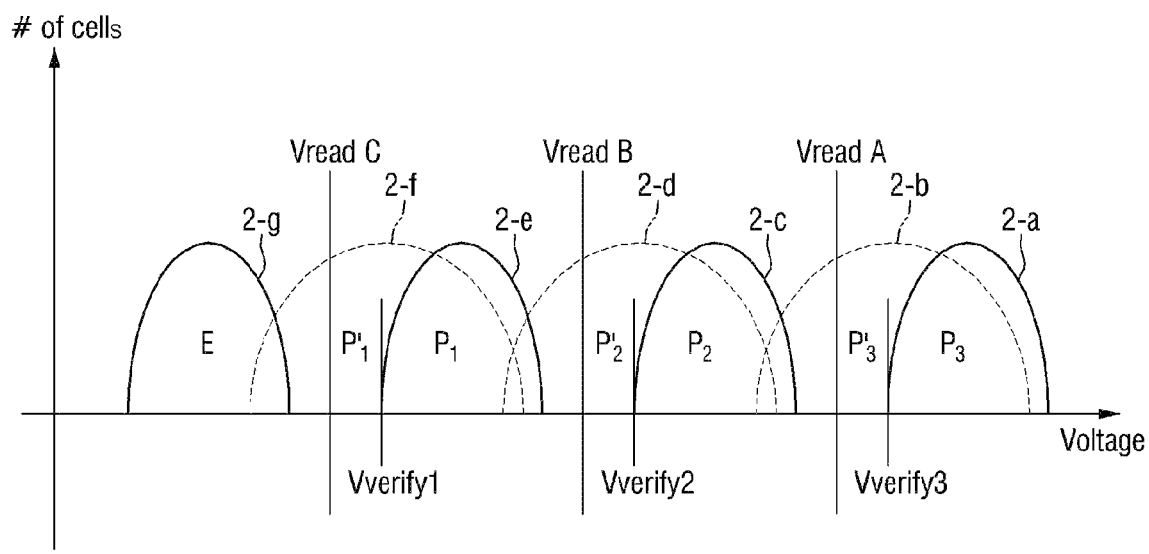
FIG. 2 illustrates a charge loss phenomenon of a 2-bit multi level cell (MLC) flash memory device.

FIG. 2 illustrates a charge loss phenomenon of a 2-bit multi level cell (MLC) flash memory device.

In order to program k bits in a memory cell of an MLC flash memory device, any one of $2^k$ threshold voltages should be formed in the memory cell. When 2 bits are stored in a cell, threshold voltages of memory cells in which the same data are programmed may form a threshold voltage distribution in a constant range due to an insignificant difference between electric characteristics of memory cells. The threshold voltage distributions may correspond to $2^k$ data values that may be generated by k bits, respectively.

Referring to FIG. 2 illustrating a 2 bit MLC flash memory device, three (3) program threshold voltage state distributions $P_1$(2-a), $P_2$(2-b), and $P_3$(2-c) immediately after a program operation, and one (1) erase threshold voltage state distribution E(2-g), are generated. Since charge loss is not generated after the program operation, there are no overlapping portions between each of $P_1$(2-e), $P_2$(2-c), and $P_3$(2-a). The threshold voltage state distributions have the respective read voltages. Therefore, in a case of 2 bit data, the number of read voltages is three (3) in total, including VreadA, VreadB, and VreadC. The read voltages VreadA, VreadB, and VreadC may be default voltages set at the time of manufacturing the nonvolatile memory. For the sake of convenient explanation, =FIG. 2, has been described with regard to a 2 bit MLC flash memory device. However, according to at least one example embodiment, a number of bits in a multi level cell of a MLC flash memory device may be more than 2. For example, a 3 bit flash memory device has seven (7) program distributions and one (1) erase distribution, and a 4 bit flash memory device has fifteen (15) program distributions and one (1) erase distribution.

In a case where the 2 bit MLC flash memory executes a program operation and then a predetermined time is elapsed, program and erase operations are repeated and another predetermined time is then elapsed, FIG. 2 illustrates exemplary threshold voltage distributions of program and erase states that may be modified due to charge loss generated when characteristics of a flash memory cell deteriorate.

In the flash memory device shown in FIG. 1, electrons trapped in a floating gate or a tunnel oxide layer may be emitted according to the passage of time, which is referred to as charge loss. As the program and erase operations are repeatedly performed, the tunnel oxide layer may deteriorate, thereby further increasing the charge loss. The charge loss may reduce a threshold voltage, so that a threshold voltage distribution may be shifted to the left.

As shown in FIG. 2, adjacent threshold voltage distributions of the respective states may overlap with each other. If the threshold voltage distributions overlap each other, when a particular read voltage is applied, the data to be read may include many errors. For example, when VreadA is applied to a memory cell in an on state, the read data resides in the $P_2$ side, and when VreadA is applied to a memory cell in an off state, the read data resides in the $P_3$ side. However, in the overlapping portion, even if the read data resides in the $P_3$ side, the memory cell may be read in an on state, generating error bits. Thus, as the threshold voltage distributions overlap each other, the read data may contain many error bits.

Figure 4A:
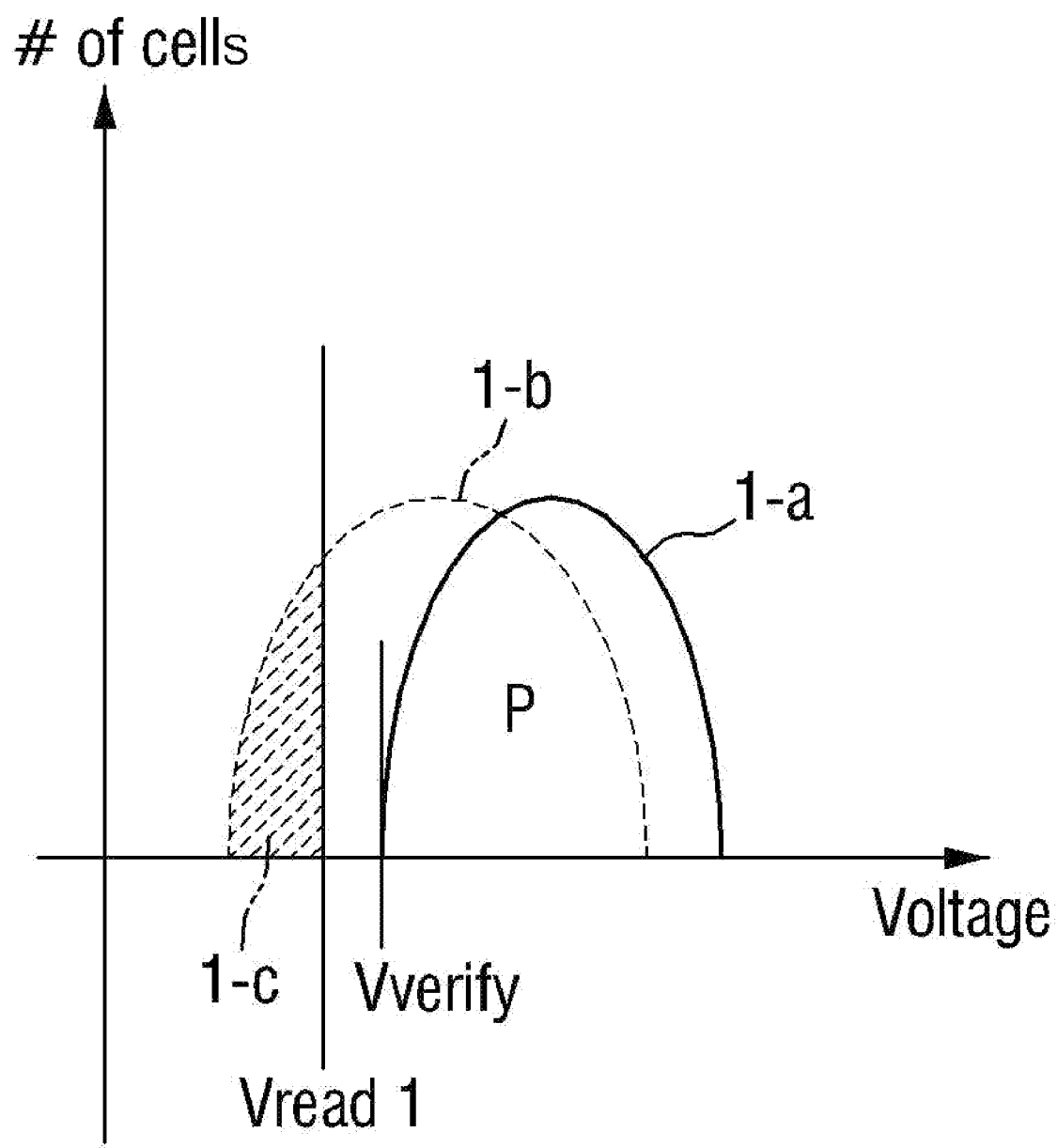
FIGS. 4A to 4C are diagrams illustrating a method of operating a nonvolatile memory device according to at least one example embodiment.
Figure 4B:
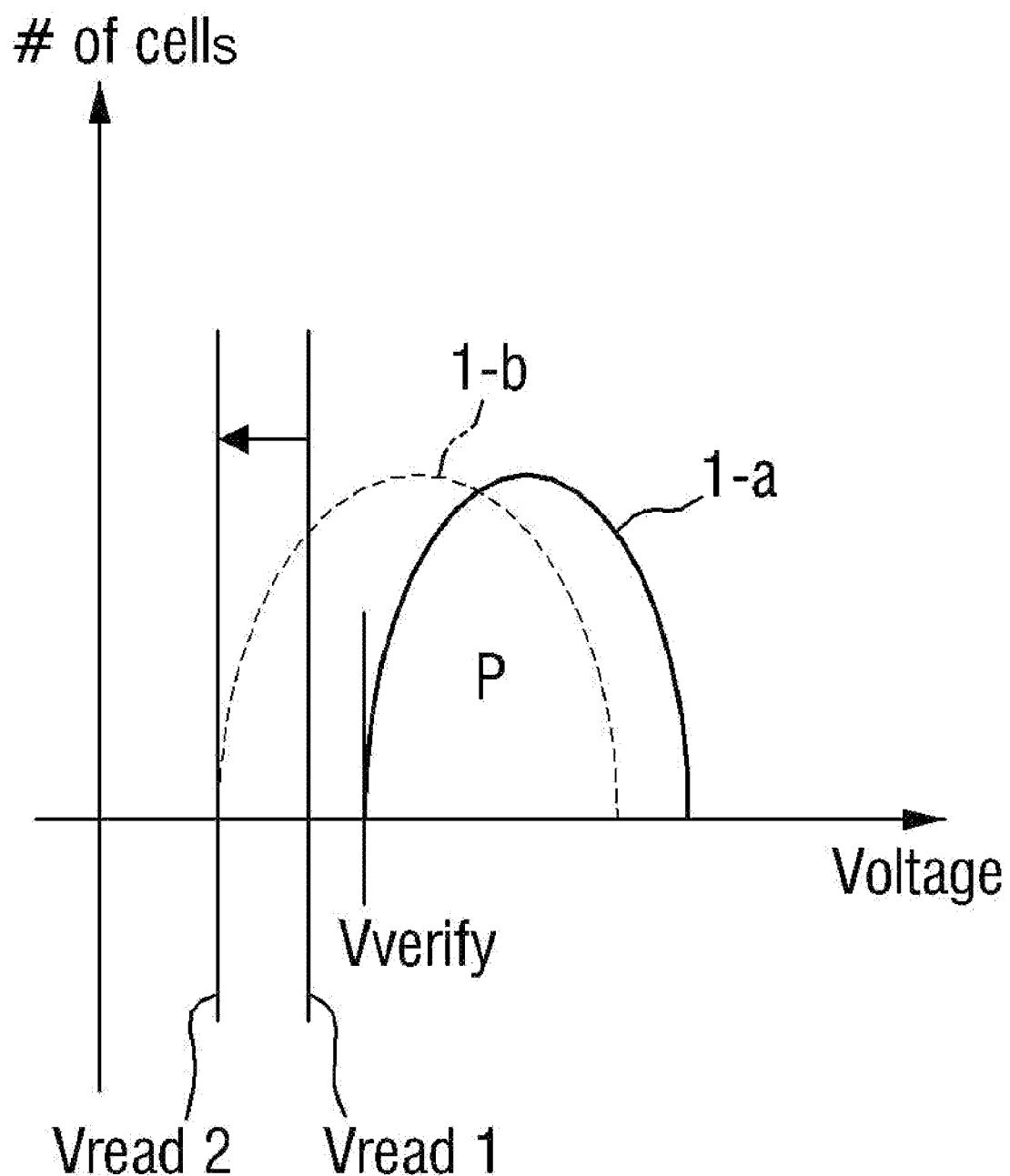
Figure 4C:
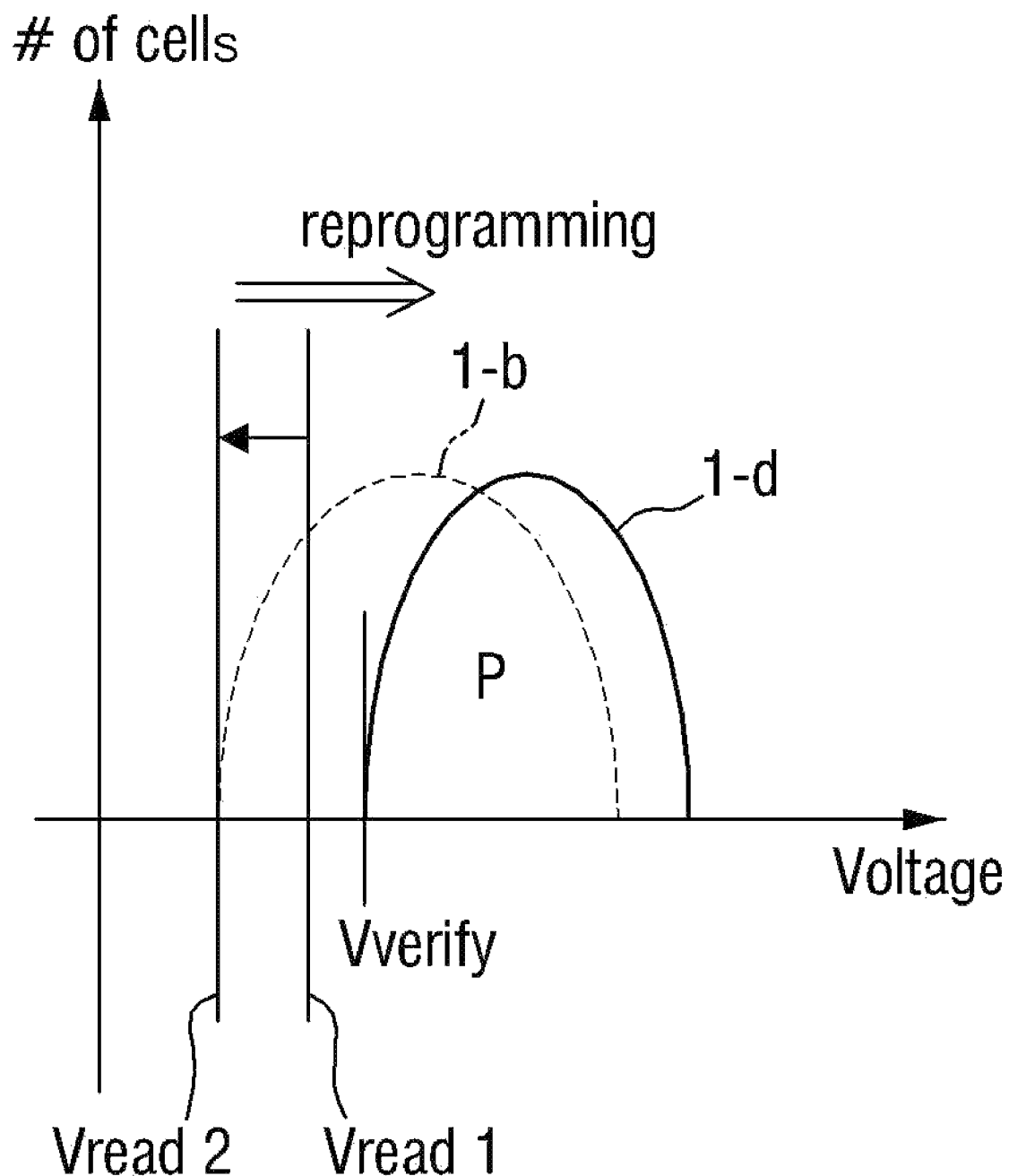

FIG. 3 is a flowchart for explaining a method of operating a nonvolatile memory device according to at least one example embodiment, and FIGS. 4A to 4C are diagrams illustrating a method of operating a nonvolatile memory device according to at least one example embodiment.

Referring first to FIGS. 3 and 4A, first data is read from a nonvolatile memory cell using a first read voltage Vread1 (S10).

In detail, as described above, a first program state distribution (1-a) is a program state distribution immediately after a program operation is performed. The first program state distribution (1-a) is positioned in the right side of a verify voltage Vverify. A second program state distribution (1-b) is a program state distribution immediately after charge loss is generated.

Here, if the first data is read from a nonvolatile memory cell corresponding to the second program state distribution (1-b) using the first read voltage Vread1, there exists a region (1-c) in which error bits of some of the first data are uncorrectable.

Meanwhile, the first read voltage Vread1 may be a default voltage set at the time of manufacturing the nonvolatile memory, but not limited thereto. Referring to FIGS. 3 and 4B, second data is read from the nonvolatile memory cell using a second read voltage Vread2 different from the first read voltage Vread1 (S20).

In detail, data of the same address is read again using the second read voltage Vread2 smaller than the first read voltage Vread1. The data read using the second read voltage Vread2 is referred to as second data. Since the second read voltage Vread2 is positioned in the left side of the second program state distribution (1-b), the second data read using the second read voltage Vread2 may be error correctable data.

Referring to FIGS. 3 and 4C, the first read voltage Vread1 and the second read voltage Vread2 are compared with each other, and the nonvolatile memory cell is reprogrammed based on the comparison result (S30).

In detail, for example, as the result of comparing the first read voltage Vread1 with the second read voltage Vread2, a difference between the first read voltage Vread1 and the second read voltage Vread2 exceeds a reference value, a reprogram operation may be performed. In the reprogram operation, a program operation is again performed on the same address as the read address using the corrected second data.

As shown, the second program state distribution (1-b) that has modified due to charge loss is shifted to the right by the reprogram operation to become a third program state distribution (1-d). That is to say, after the reprogram operation, the state distribution of the nonvolatile memory device may become the same as or similar to the first program state distribution (1-a) formed immediately after the normal program operation is performed. Therefore, the reprogram operation may improve the data reliability of the nonvolatile memory device and extending the life of the nonvolatile memory device.

Figure 5:
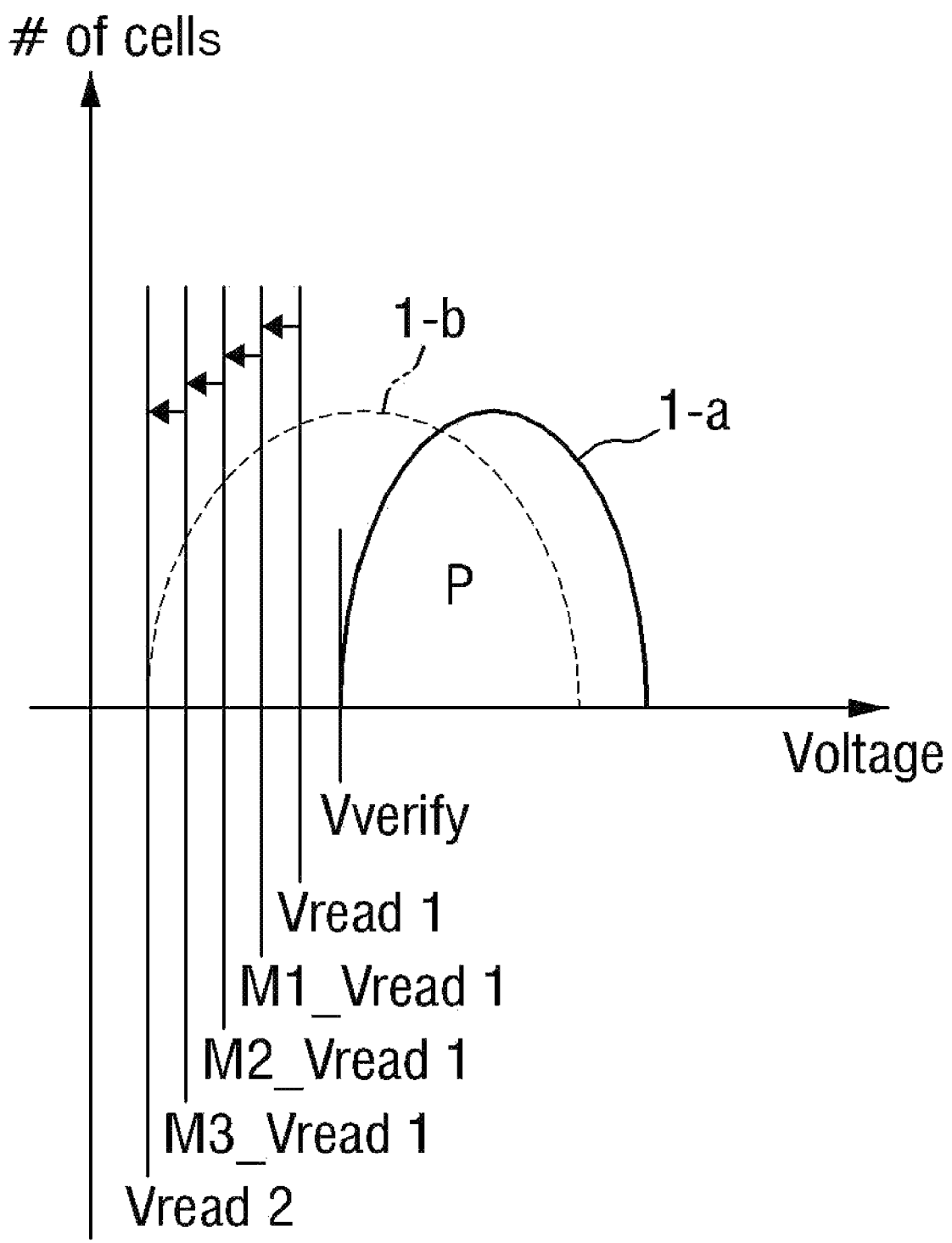
FIG. 5 illustrates read voltage variations in a method of operating a nonvolatile memory device according to at least one example embodiment.

FIG. 5 illustrates read voltage variations in a method of operating a nonvolatile memory device according to at least one example embodiment.

Referring to FIG. 5, the first program state distribution (1-a) is positioned in the right side of the verify voltage Vverify, as shown in FIG. 1, and the second program state distribution (1-b) is formed after the charge loss is generated. When memory cells corresponding to the second program state distribution are read using the first read voltage Vread 1, uncorrectable error bits may be generated. As will later be described with reference to FIGS. 7 and 8, when an uncorrectable error bit is generated, a memory controller may provide information regarding the second read voltage to the nonvolatile memory device.

Referring to FIG. 5, third data may be received from a cell array of the nonvolatile memory device using one or more third read voltages M1_Vread1, M2_Vread2 and M3_Vread3 smaller than the first read voltage and greater than the second read voltage. The third data may include uncorrectable error bits. That is to say, read operations may be repeated using the one or more third read voltages modified to gradually decrease until second data having correctable error bits is received.

Figure 6:
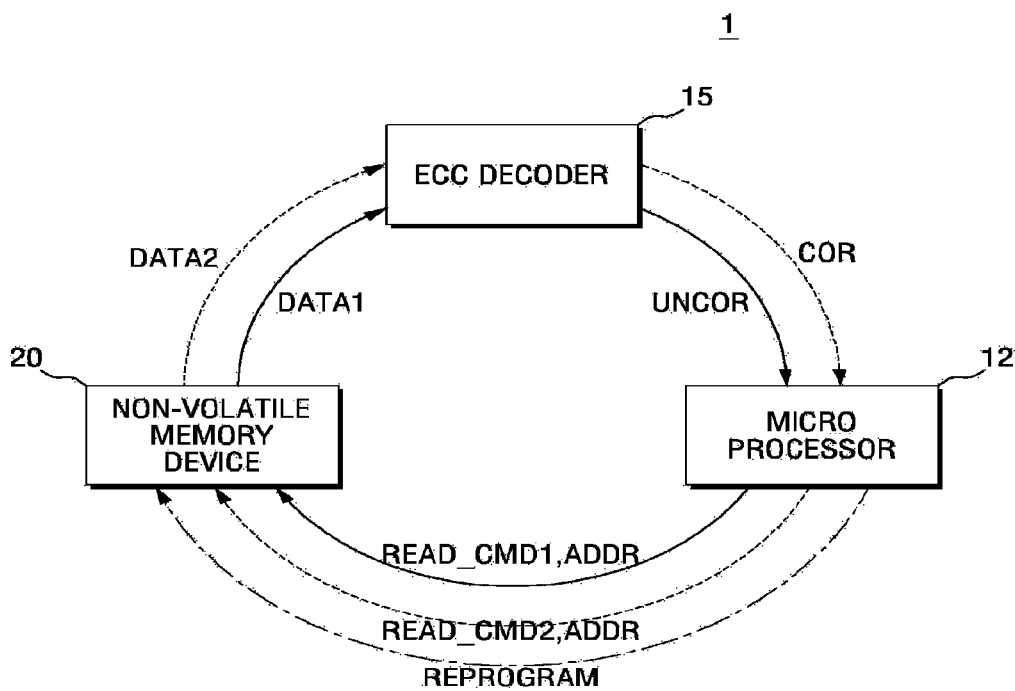
FIG. 6 is a block diagram for explaining a memory system according to at least one example embodiment.

FIG. 6 is a block diagram for explaining a memory system according to at least one example embodiment.

Referring to FIG. 6, the memory system 1 according to at least one example embodiment may include a nonvolatile memory device 20, a microprocessor 12, and an error correction code (ECC) decoder 15.

The microprocessor 12 provides a first read command READ_CMD1 and an address ADDR to the nonvolatile memory device 20.

The nonvolatile memory device 20 outputs first data DATA1 corresponding to the address ADDR using the first read voltage (Vread1 of FIG. 4A) in accordance with the first read command READ_CMD1. As described above, since charge loss is generated in the nonvolatile memory device 20, the first data DATA1 contains uncorrectable error bits.

The ECC decoder 15 receives the first data DATA1 and outputs a correction fail signal UNCOR indicating that error correction is failed.

The microprocessor 12 receives the correction fail signal UNCOR and delivers a second read command READ_CMD2 and an address ADDR.

The nonvolatile memory device 20 outputs second data DATA2 corresponding to the address ADDR using the second read voltage (Vread2 of FIG. 4B) different from the first read voltage Vread1 in accordance with the second read command READ_CMD2. The second read voltage Vread2 has a lower level than the first read voltage Vread1. The second data DATA2 is supplied to the ECC decoder 15. Uncorrectable error bits are not included in the second data DATA2. The ECC decoder 15 performs error bit correction on the second data. The ECC decoder 15 provides information regarding error correction performance COR to the microprocessor 12. If the ECC decoder 15 succeeds in error bit correction, the microprocessor 12 compares a level of the first read voltage Vread1 with that of the second read voltage Vread2, and if a level difference between the first read voltage Vread1 and the second read voltage Vread2 is greater than a reference value, the microprocessor 12 determines to reprogram the nonvolatile memory device 20.

Figure 7:
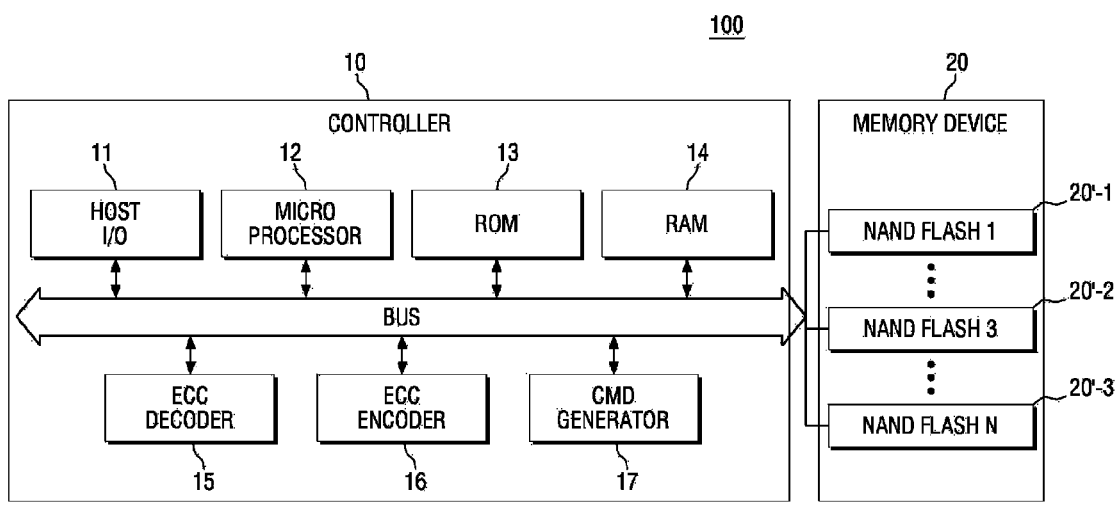
FIG. 7 is a block diagram of a memory system according to at least one example embodiment.

FIG. 7 is a block diagram illustrating a memory system according to at least one example embodiment. The memory system includes a controller 10 and a nonvolatile memory device 20. Examples of the nonvolatile memory device 20 may include a NAND flash memory device, but not limited thereto. The nonvolatile memory device 20 may include a plurality of NAND flash memories 20'-1, 20'-2 and 20'-3. The controller 10 may include a microprocessor 12, a read only memory (ROM) 13, a random access memory (RAM) 14, an ECC decoder 15, an ECC encoder 16, a command (CMD) generator 17, a host input/output (I/O) 11, and a bus 18. The components of the controller 10 may be electrically connected to each other through the bus 18.

The microprocessor 12 controls the overall operation of the memory system 100 including the controller 10. When power is applied to the memory system 100, the microprocessor 12 drives a firmware for operating the memory system 100 stored in the ROM 13 on the RAM 14, thereby driving the overall operation of the memory system 100.

While FIG. 7 shows that codes of the firmware for driving the memory system 100 are stored in the ROM 13, example embodiments are not limited thereto. According to at least one example embodiment, the firmware codes may be stored in various nonvolatile memory devices, for example, the NAND flash memory device 20, other than the ROM 13. Thus, control or intervention of the microprocessor 12 may include not only direct control of the microprocessor 12 but also intervention of firmware that is software driven by the microprocessor 12.

The RAM 14 is a memory serving as a buffer and may store initial commands and data input through the host I/O 11, various parameters or data output from the nonvolatile memory device 20, data, parameters and variables input/output to/from the nonvolatile memory device 20.

The host I/O 11 may provide an interface between the memory system 100 including the controller 10 and the host in accordance with a predetermined protocol.

The host interface may communicate with an external host through an interface protocol such as a universal serial bus (USB) protocol, a small computer system interface (SCSI), a peripheral component interconnection (PCI) express protocol, an advance technology attachment (ATA) protocol, a parallel ATA (PATA) protocol, a serial ATA (SATA) protocol, or a serial attached SCSI (SAS) protocol.

The ECC decoder 15 and the ECC encoder 16 correct error bits. The ECC encoder 16 performs error correction encoding on data input through the host I/O 11 (or interface) of the memory system and generate data with a parity bit added thereto. The parity bit may be stored in the memory device 20.

The ECC decoder 15 performs error correction decoding on the output data, determines whether the error correction decoding is successfully performed or not, and outputs an instruction signal according to the determination result. The read data is transmitted to the ECC decoder 15, and the ECC decoder 15 may correct error bits of the data using the parity bit. If the number of error bits generated is greater than a correctable error bit tolerance limit, the ECC decoder 15 cannot correct the generated error bits and error correction is failed. The ECC encoder 16 and the ECC decoder 15 may perform error correction using low density parity check (LDPC) codes, Bose, Chaudhuri, and Hocquenghem (BCH) codes, turbo codes, Reed-Solomon codes, convolution codes, recursive systematic codes (RSC), or coded modulation such as trellis-coded modulation (TCM) or block coded modulation (BCM), but not limited thereto.

Each of the ECC encoder 16 and the ECC decoder 15 may include a circuit, a system and a device, for error correction.

The command generator 17 generates commands to be executed by the nonvolatile memory device 20 and applies the commands to the memory device 20. The commands may include a program command, a read command, a reread command, a second read command, and so on, but not limited thereto.

Referring to FIGS. 6 and 7, the command generator 17 may apply the first read command Read_CMD1 and the address ADDR to the nonvolatile memory device 20 under the control of the microprocessor 12. The nonvolatile memory device 20 reads data of a designated address ADDR using the first read voltage Vread1.

While FIG. 7 illustrates that the nonvolatile memory device 20 includes NAND flash memories 20'-1, 20'-2 and 20'-3, example embodiments are not limited to this arrangement. The current embodiment will now be described with reference to the NAND flash memory device 20.

Referring to FIG. 4B, the first read voltage Vread1 may be a default voltage set at the time of manufacturing the nonvolatile memory device 20. The information regarding the first read voltage Vread1 may be stored in the ROM 13 or the NAND flash memory device 20. The first data read using the first read voltage Vread1 is transmitted to the ECC decoder 15. If the number of error bits generated is greater than a correctable error bit tolerance lim, the ECC decoder 15 cannot correct the generated error bits, failing in error correction. If the ECC decoder 15 fails in error correction, a correction fail signal UNCOR is transmitted to the microprocessor 12. The microprocessor 12 may transmit second voltage information, that is, an offset value indicating a shift amount from a first read voltage, to the NAND flash memory device 20. The NAND flash memory device 20 may read second data from the same address of the NAND flash memory device 20 using the second read voltage Vread2 that is smaller than the first voltage by the offset value.

The second data has no uncorrectable error bit, and the ECC decoder 15 may correct error bits of the second data.

If the second data is received, the microprocessor 12 compares the first read voltage with the second read voltage and determines whether to reprogram the NAND flash memory device 20. Referring to FIG. 4C, if a level difference between the first read voltage Vread1 and the second read voltage Vread2 is greater than the reference value, the microprocessor 12 may determine to reprogram the NAND flash memory device 20.

Referring to FIGS. 5 and 7, between the reading of the first read data and the reading of the second data, there may further be provided receiving third data from the NAND flash memory device 20 using one or more third read voltages M1_Vread1, M2_Vread2 and M3_Vread3 smaller than the first read voltage Vread1 and greater than the second read voltage Vread2.

Referring to FIG. 5, as the result of reading the third data specifically using the first read voltage Vread1, if an uncorrectable error bit is generated, the microprocessor 12 may transmit voltage information, that is, an offset value of 0.2, to the NAND flash memory device 20. The NAND flash memory device 20 may reread the data of the same address using the third read voltage M_Vread1, which is a modified read voltage value 0.2 V smaller than the first read voltage Vread1. The microprocessor 12 may repeatedly transmit the offset value to the NAND flash memory device 20 until no further uncorrectable error bit is generated. Therefore, the read operations may be repeatedly performed using one or more third read voltages until the second data DATA2 having correctable error bit is received.

FIG. 7 will now be described. Assuming that the data read using the first read voltage Vread1 is first data including uncorrectable error bits, the command generator 17 may generate a read retry command under the control of the microprocessor 12 and transmit the same to the NAND flash memory device 20. The information regarding read voltage values corresponding to the read retry command is grouped and stored in the NAND flash memory device 20. The microprocessor 12 may transmit a signal to select a particular level from the group of read levels stored in the NAND flash memory device 20. Alternatively, if the read retry command is transmitted to the NAND flash memory device 20, the NAND flash memory device 20 may select the stored read voltage information, modify the read voltage, and read data corresponding to the same address using the modified read voltage. The read operations may be repeated using the modified read voltage until the second data is output. Like in the previous embodiment, in the current embodiment, the microprocessor 12 calculates a difference between the first read voltage and the second read voltage. If the difference is greater than a reference value, the microprocessor 12 may determine to reprogram the NAND flash memory device 20, which will be described below in detail with reference to FIG. 8.

Figure 8:
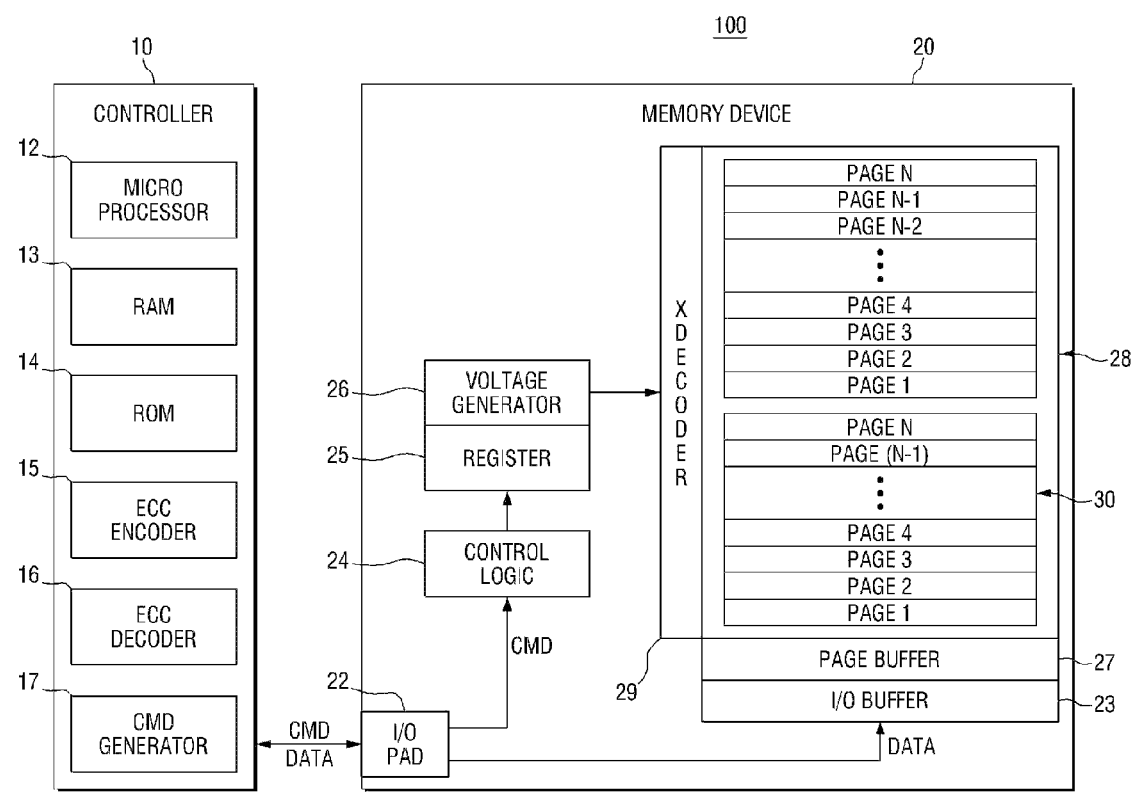
FIG. 8 is a block diagram of a memory system according to at least one example embodiment.
Figure 9:
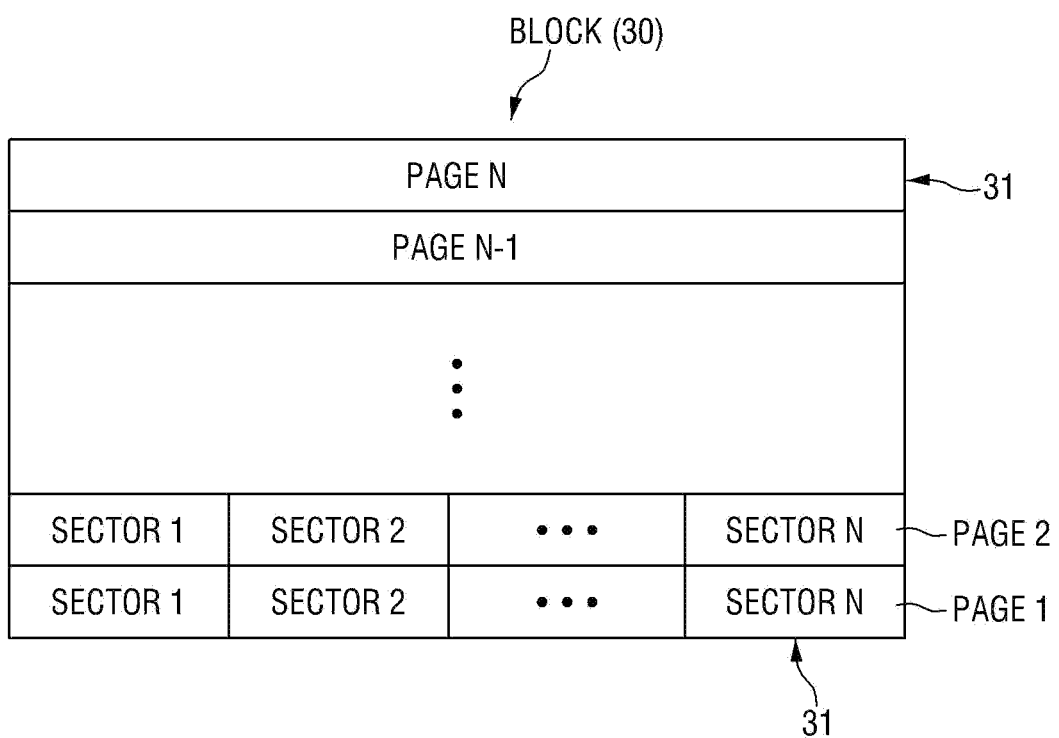
FIG. 9 is a detailed diagram of a block of a cell array shown in FIG. 8.

FIG. 8 is a block diagram of a memory system according to at least one example embodiment, and FIG. 9 is a detailed diagram of a block of a cell array shown in FIG. 8.

Components of the controller 10 are the same as those shown in FIG. 8, and may include a microprocessor 12, an RAM 14, an ROM 13, an ECC encoder 16, an ECC decoder 15, and a command (CMD) generator 17. As shown in FIG. 7, the respective components are electrically connected to each other through a bus 18. Functions of the respective components of the controller 10 are the same as described above. While the nonvolatile memory device 20 including NAND flash 1 to NAND flash N is illustrated in FIG. 7 by way of example, example embodiments are not limited to this arrangement.

The NAND flash memory device 20 may include a cell array 28, an X-decoder (column select circuit) 29, a voltage generator 26, input/output (I/O) pad 22, an input/output (I/O) buffer 23, a page buffer 27, and a control logic 24.

The memory cell array 28 may include a plurality of wordlines W/L and a plurality of bitlines B/L, and each memory cell may store 1-bit data or M-bit data (M is a natural number of 2 or greater.). Each memory cell may be implemented by a memory cell having a floating gate or a charge storage layer such as a charge trapping layer or a memory cell having a variable resistance element.

The cell array 28 may include a plurality of blocks 30 and a plurality of pages 31.

FIG. 9 is a detailed diagram of a block (30) of a cell array (28) shown in FIG. 8.

Referring to FIG. 9, one block includes a plurality of pages 31, and one page includes a plurality of sectors 32. In detail, one of the plurality of pages 31 may include eight (8) sectors 32. The pages 31 may become units for program and read operations and the blocks 30 may become units for erase operation.

The memory cell array 28 may be implemented to have a single-layer array structure (also called a two-dimensional array structure) or a multi-layer array structure (also called a three-dimensional array structure).

Referring to FIG. 8, the control logic 24 controls the overall operation of the flash memory device 20. If a command CMD is input from the controller 10, the control logic 24 interprets the command CMD and performs an operation based on the command interpret by the flash memory device 20, for example, a program operation, a read operation, a read retry operation, an erase operation, or the like.

The X-decoder 29 is controlled by the control logic 24 and drives at least one of the word lines implemented in the memory cell array 28 along row addresses.

The voltage generator 26 generates one or more voltages necessary for a program operation, a first read operation, a second read operation, or an erase operation and supplies the one or more voltages selected by the X-decoder 29.

The register 25 is a space in which information input from the controller 10 is stored, and may include a plurality of latches. For example, if the microprocessor 12 in the controller 10 transmits read voltage information, that is, an offset value, to the flash memory device 20, the offset value may be stored in the register 25. Alternatively, the register 25 may store information grouped and tabulated read voltage information.

The page buffer circuit 27 is controlled by the control logic 24 and may operate as a sense amplifier or a write driver according to the operation mode, for example, a read operation or a program operation.

The I/O pad 22 and the I/O buffer 23 may become input/output paths of data communicated with an external device, for example, between the controller 10 or host and the nonvolatile memory device 20.

If the NAND flash memory device 20 receives the first read command READ_CMD1, the voltage generator 26 generates a first read voltage that is a default read voltage. The first read voltage may be applied to the first page 31 corresponding to a pertinent address through the X-decoder 29. The read data is sensed by the page buffer 27 and is transmitted to the ECC decoder 15 through the I/O pad 22. The ECC decoder 15 performs error bit correction on the read data. If the read data is first data including an uncorrectable error bit, the ECC decoder 15 may transmit a correction fail signal UNCOR indicating that error correction is failed to the microprocessor 12. The microprocessor 12 may transmit read voltage information, that is, an offset value indicating that the first read voltage to be moved by a predetermined voltage value, to the flash memory device 20.

The offset value may be stored in the register 25. The voltage generator 26 may generate a second read voltage that is modified by a voltage value corresponding to the offset value stored in the register 25 by referring to the offset value stored in the register 25. The second read voltage may be applied to the second page through the X-decoder 29. The memory cell array 28 reads the second page using the second read voltage and then transmit the second data including a correctable error bit to the ECC decoder 15 through the I/O pad 22. The first data may be stored in a first block including the first page corresponding to a first page address of the NAND flash memory device 20, and the second data may be stored in a second block including the second page corresponding to a second page address of the NAND flash memory device 20. The first page address and the second page address are physically the same address. The first block and the second block may have physically the same block address.

Referring to FIGS. 5 and 8, the microprocessor 12 repeatedly supplies read voltage information, that is, the offset value, to the NAND flash memory device 20 until no further uncorrectable error bit is generated, as shown in FIG. 7. After receiving the offset value, the NAND flash memory device 20 may repeatedly perform read operations using the third read voltage corresponding to the offset value. The same address region of the NAND flash memory device 20 is repeatedly read using third read voltages M1_Vread1, M2_Vread2 and M3_VReade3 until the second voltage Vread2 is generated. The second data is read using the second read voltage Vread2, and error bits of the second data may be corrected by the ECC decoder 15.

If the ECC decoder 15 performs error bit correction, the microprocessor 12 compares the first read voltage with the second read voltage and determines whether to reprogram the NAND flash memory device 20. Here, the reprogram operation is to program the error bit corrected second data on the first page or the second page. For example, the reprogram operation is to perform a program operation again on the first page read using the second error bit corrected second data. In other words, the first block including the first page is continuously used, instead of treating the same as a bad block.

Therefore, the reprogram operation may be effectively used for bad block management. In addition, the reprogram operation may be performed on the entire first block including the first page as well as the first page. Alternatively, the reprogram operation may be performed on the entire second block including the first page as well as the second page. In a case where the reprogram operation is performed on the entire block, data is read on a page-by-page basis. In addition, the ECC decoder 15 performs error bit correction on the read data and performs a reprogram operation on each read page using the corrected data.

The microprocessor 12 may manage program and/or erase cycles in a wear leveling manner. The program and/or erase cycles refer to numbers of program and/or erase operations of each memory block 30. As well known to one skilled in the related art, information regarding the program and/or erase cycles may be stored in the memory cell array 28 of the NAND flash memory device 20 or the RAM 14. The wear leveling manner is to prevent the program and/or erase operations from being performed only on several particular memory blocks. In the wear leveling manner, the program and/or erase operations may be performed uniformly throughout the memory blocks. The blocks on which the same number of erase operations are performed may be subjected to the same number of program operations and may be worn out to substantially the same extent. Thus, if the microprocessor 12 determines to reprogram the first page, the first block including the first page and/or one or more third blocks on which the same number of erase operations are performed, may be reprogrammed.

Alternatively, if the microprocessor 12 determines to reprogram the first page, the first block including the first page and/or one or more fourth blocks on which the same number of program operations as that performed on the first block are performed, may be reprogrammed.

In addition, it is assumed that continuous data to be programmed are input to the controller 10 through the host input/output (I/O) 11. Programming of data is performed in units of the pages 31, and each of the pages 31 may include a plurality of sectors 32. Referring to FIG. 9, one block 30 includes a plurality of pages 31. Each of the pages 31 may include a plurality of sectors 32. For example, in a 16 Gb NAND flash memory device, one page may include 512 byte memory cells. In addition, one page may be divided into 8 sectors. For example, in a case where data to be programmed has a capacity of 5 K sectors, the data can be analyzed as continuous data. The continuous data may be stored in the first block including the first page and one or more fifth block. In other words, the continuous data may be divided in a plurality of blocks 30 of the flash memory device 20 to be programmed.

The 5K sectors are provided only for illustration, and continuous data may be defined as data exceeding a predetermined reference number of sectors. Since the first block and one or more fifth blocks have the same program timing, after the program operation is performed, charge loss may be generated in both of the first block and one or more fifth blocks with the same probability. Thus, if the microprocessor 12 determines to reprogram the first page, the first block including the first page and/or one or more fifth blocks storing a large capacity of data may be reprogrammed.

In addition, it may be assumed that a large capacity of file data to be programmed is input to the controller 10 through the host I/O 11. The large capacity of file data generally refers to motion picture data. The programming of data is performed in units of pages 31, and each of the pages 31 may include a plurality of sectors 32. As described above with regard to the continuous data, the large capacity of file data may be defined as data exceeding a predetermined reference number of sectors. For example, if file data to be programmed has a capacity of greater than or equal to 8K sectors, the file data may be analyzed as large capacity file data. The large capacity file data may be stored in a first block including a first page and one or more sixth blocks. In other words, the large capacity file data may be divided into a plurality of blocks 30 of the flash memory device 20 to then be programmed.

Since the first block and the one or more sixth blocks are programmed at the same time, after the program operation is performed, charge loss may be generated in both blocks with the same or similar probability. Thus, when the microprocessor 12 determines to reprogram the first page, the first block including the first page and/or the one or more sixth blocks storing the large capacity file data may be reprogrammed.

Figure 10:
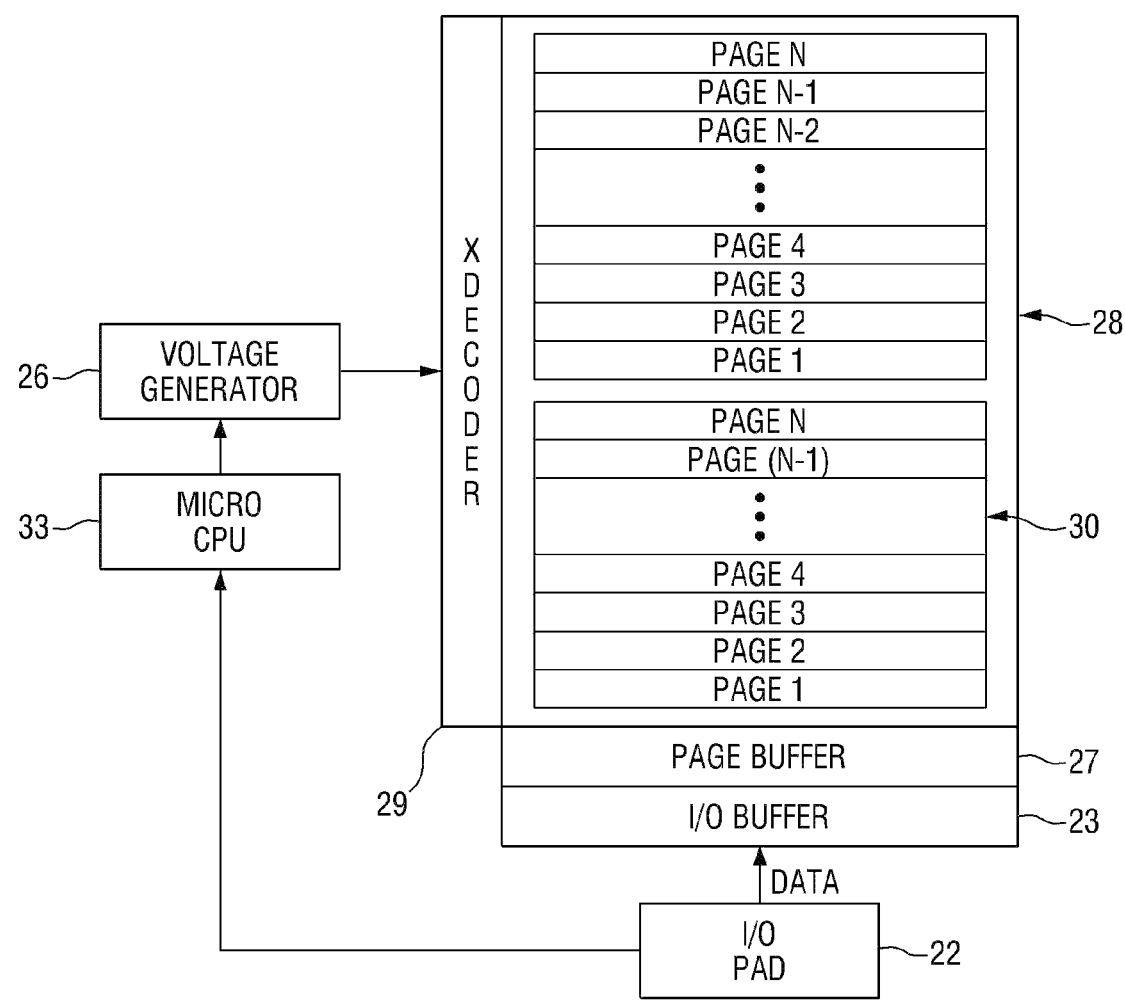
FIG. 10 is a block diagram of a nonvolatile memory device according to at least one example embodiment.

FIG. 10 is a block diagram of a nonvolatile memory device according to at least one example embodiment.

Referring to FIG. 10, in the same manner as described above in FIG. 8, a nonvolatile memory device 20 will be described with regard to a NAND flash memory device 20-1 by way of example. The NAND flash memory device 20 may include a cell array 28, an X-decoder (column select circuit) 29, a voltage generator 26, an I/O pad 22, an I/O buffer 23, and a page buffer 27. Referring to FIG. 10, the cell array 28, the X-decoder 29, the voltage generator 26, the I/O pad 22, the I/O buffer 23, and the page buffer 27 may be substantially the same as those shown in FIG. 8.

Referring to FIG. 10, the NAND flash memory device 20 may include a micro central processor unit (Micro CPU) 33. The micro CPU 33 may control the overall operation of the NAND flash memory device 20. It is assumed that the micro CPU 33 receives a read command and a particular address from the I/O pad 22. The voltage generator 26 generates a first read voltage under the control of the micro CPU 33 and supplies the same to the X-decoder 29. The first page data read using the first read voltage is output to the controller 10 through the I/O pad 22. As the result of error bit correction, when the first data includes an uncorrectable error bit and error correction is failed, the controller 10 may supply the read command to the memory device 20-. After receiving the read command through the I/O pad 22, the micro CPU 33 may control the voltage generator 26. In other words, the micro CPU 33 may determine a read voltage decrement and may control the voltage generator 26 to generate a second read voltage smaller than the first read voltage. The NAND flash memory device 20-1 reads data of a page corresponding to the same address as the first page using the second read voltage. The second data read using the second read voltage is output to the controller 10, and the controller 10 performs error bit correction.

If the error bit of the second data is corrected, the controller 10 may control the NAND flash memory device 20 to terminate a read operation. If the read operation is terminated, the micro CPU 33 calculates a difference value between the first read voltage and the second read voltage. If the difference value is greater than a reference value, the micro CPU 33 may determine the NAND flash memory device 20 to perform a reprogram or recharge operation. If the reprogram operation is determined, the micro CPU 33 may control the read page to be reprogrammed using the second data. Referring to FIG. 5, the same page may be repeatedly read using a third read voltage smaller than the first read voltage and greater than the second read voltage until the second data is received.

As described above with reference to FIG. 8, the micro CPU 33 may determine to reprogram the entire first block 30 including the first page 31. In addition, large capacity data may be separately stored in the first block and the one or more sixth blocks. If the reprogram operation of the first page is determined, the micro CPU 33 may reprogram the first block and the one or more sixth blocks. In addition, if the reprogram operation of the first page is determined, the micro CPU 33 may determine to entirely reprogram one or more blocks having the large capacity data programmed therein. In addition, since continuous data may also be programmed in multiple blocks of the NAND flash memory device 20, all of the blocks having the continuous data programmed may be determined to be reprogrammed. In addition, as shown in FIG. 8, since the controller 10 performs wear leveling, one or more memory blocks having the same numbers of program and/or erase operations may be determined to be reprogrammed.

Although not shown in FIG. 10, the micro CPU 33 may include an ECC decoder for correcting error bits of read data. The micro CPU 33 may determine whether to perform error bit correction on first data read using a first read voltage. Since the first data is uncorrectable data, the voltage generator 26 generates a read voltage smaller than the first read voltage under the control of the micro CPU 33 and supplies the generated read voltage to the X-decoder 29. The micro CPU 33 checks whether the read data includes uncorrectable error bits, and controls the voltage generator 26 until there is no more uncorrectable error bit.

The voltage generator 26 generates gradually decreasing voltages under the control the micro CPU 33, and the memory device 20-1 may repeatedly perform read operations of the same page using a modified read voltage. When the second data having a correctable error bit is read using the second read voltage, the operation is terminated. The micro CPU 33 calculates a difference value between the first voltage and the second voltage, and if the difference value is greater than the reference value, the micro CPU 33 may determine to perform a reprogram operation.

Figure 11:
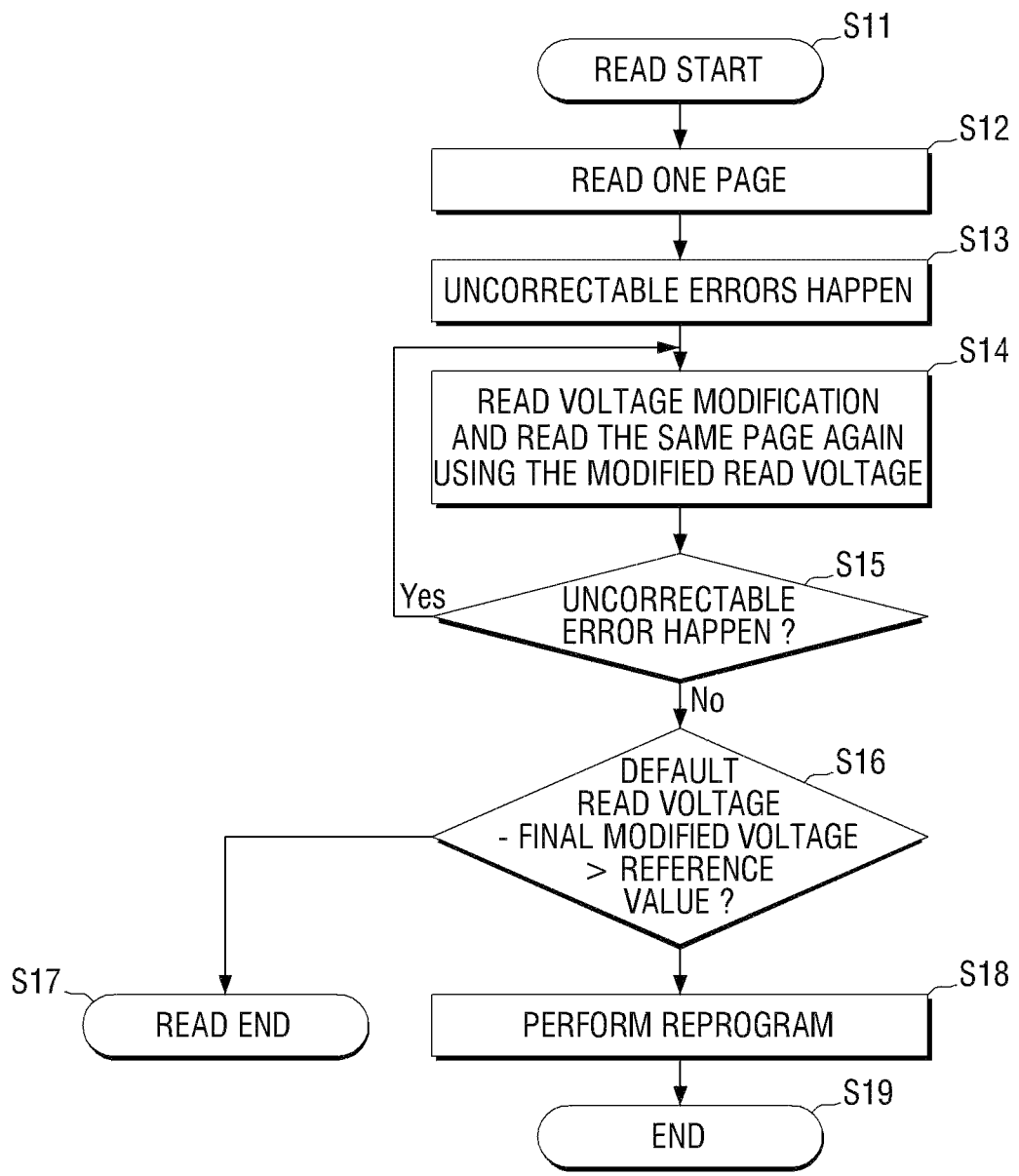
FIG. 11 is a flowchart for explaining a method of operating a nonvolatile memory device according to at least one example embodiment.

FIG. 11 is a flowchart for explaining a method of operating a nonvolatile memory device according to at least one example embodiment.

The NAND flash memory device 20 is illustrated in FIG. 11 by way of example. Referring to FIG. 11, a read operation data of the NAND flash memory device 20 is started (S11). The NAND flash memory device 20 performs the read operation using a first read voltage. In the NAND flash memory device 20, since the read operation is performed on a page-by-page basis, a first page corresponding to a first page address is read (S12). It is assumed that the read first data includes an uncorrectable error bit and error correction is failed (S13). If the error correction is failed, the controller 10 may control the NAND flash memory device 20 to modify the read voltage. The NAND flash memory device 20 reads again a page corresponding to the same address as that of the first page using the modified read voltage (S14). If the data read using the modified read voltage includes an uncorrectable error bit, the procedure returns to step S14. Then, the read voltage is again modified and data of a page corresponding to the same address as that of the first page using the modified read voltage.

The read voltage is continuously modified until the read data does not include an uncorrectable error bit, and the read operation is repeatedly performed on the page corresponding to the same address as that of the first page using the modified read voltage. When second data is read using a second read voltage, the ECC decoder corrects 20 error bits, and the controller 10 compares the first read voltage used in step S12 with the second read voltage. If a difference value between the first read voltage and the second read voltage is smaller than a reference value, the read operation is terminated (S17). If a difference value between the first read voltage and the second read voltage is greater than or equal to the reference value, the controller 10 determines the NAND flash memory device to perform a reprogram operation (S18).

Figure 12:
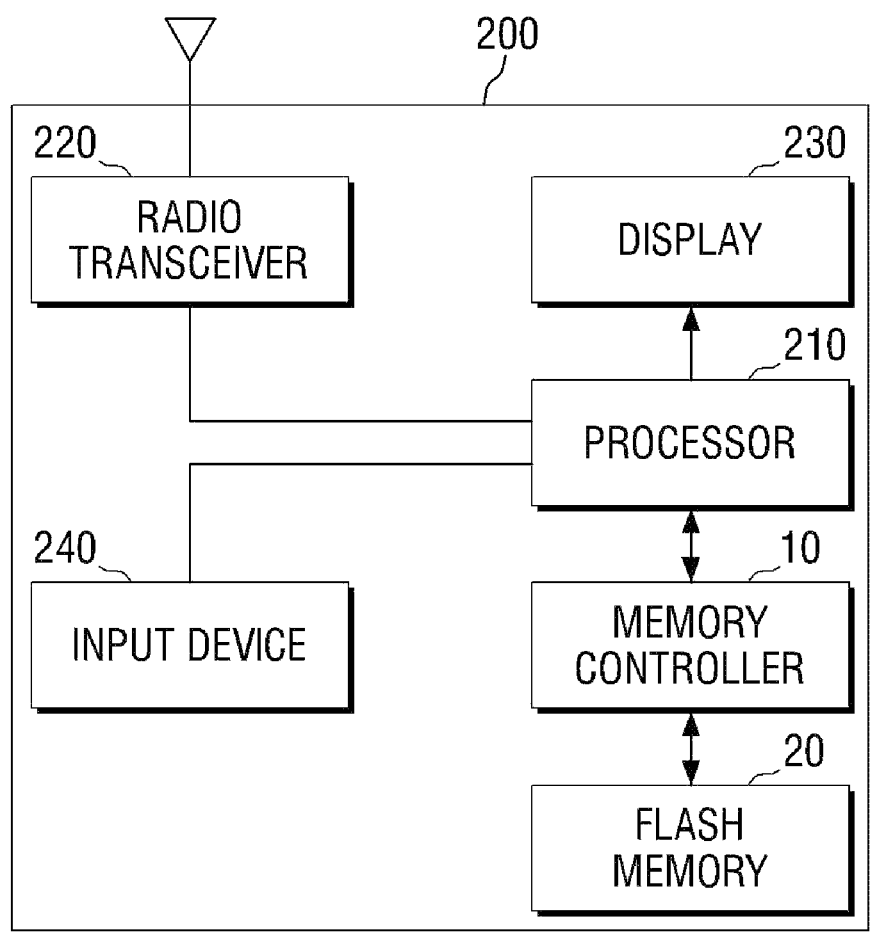
FIG. 12 is a block diagram of an electronic device including a nonvolatile memory device according to at least one example embodiment.

FIG. 12 is a block diagram of an electronic device including a nonvolatile memory device according to at least one example embodiment.

Referring to FIG. 12, the electronic device 200, such as a cellular phone, a smart phone, or a tablet PC, may include a nonvolatile memory device 20 implemented by a flash memory device, and a memory controller 10 capable of controlling the operation of the nonvolatile memory device 20.

The nonvolatile memory device 20 may be the same as that shown in FIG. 7 or 8. The memory controller 10 may be the same as that shown in FIG. 7 or 8.

The memory controller 10 is controlled by a processor 210 that controls the overall operation of the electronic device 200.

Data stored in the nonvolatile memory device 20 may be displayed on a display 230 under the control of the memory controller 10 operating under the control of the processor 210.

A radio transceiver 220 may transmit or receive a radio signal through an antenna ANT. For example, the radio transceiver 220 may convert the radio signal received through the antenna ANT into a signal to be processed by the processor 210. Therefore, the processor 210 may process the signal output from the radio transceiver 220 and may store the processed signal in the nonvolatile memory device 20 or display the processed signal on the display 230 under the control of the memory controller 10.

The radio transceiver 220 may convert the signal output from the processor 210 into a radio signal, and may output the converted radio signal to the outside through the antenna ANT.

An input device 240 is a device that is capable of inputting a control signal used to control the operation of the processor 210 or data to be processed by the processor 210. The input device 240 may be implemented by a pointing device such as a touch pad or a computer mouse, a keypad, or a keyboard.

The processor 210 may control the display 230 to display the data output from the nonvolatile memory device 20, the radio signal output from the radio transceiver 220, or the data output from the input device 240.

Figure 13:
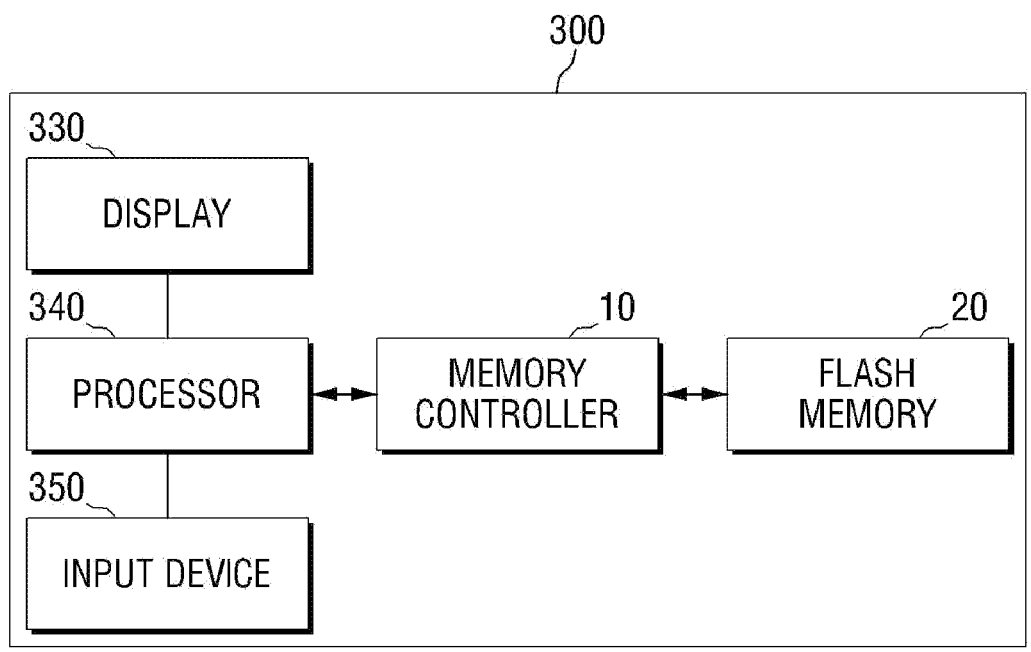
FIG. 13 is a block diagram of an electronic device including a nonvolatile memory device according to at least one example embodiment.

FIG. 13 is a block diagram of an electronic device including a nonvolatile memory device according to at least one example embodiment.

Referring to FIG. 13, the electronic device 300 may include a nonvolatile memory device 20, such as a flash memory device implemented by a data processing device such as a personal computer (PC), a tablet computer, a net-book, an e-reader, a personal digital assistant (PDA), a portable multimedia player (PMP), an MP3 player, or an MP4 player, and a memory controller 10 capable of controlling the operation of the nonvolatile memory device 20.

The memory controller 10 may perform the same function as that shown in FIG. 8. That is to say, the memory controller 10 may determine whether first data can be corrected during a read operation, and may determine the nonvolatile memory device 20 to perform a reprogram operation.

The electronic device 300 may include a processor 340 for controlling the overall operation of the electronic device 300. The memory controller 10 is controlled by the processor 340.

The processor 340 may control data stored in the nonvolatile memory device 20 in accordance with an input signal generated by an input device 350 to be displayed on a display 330. For example, the input device 350 may be implemented by a pointing device such as a touch pad or a computer mouse, a keypad, or a keyboard.

Figure 14:
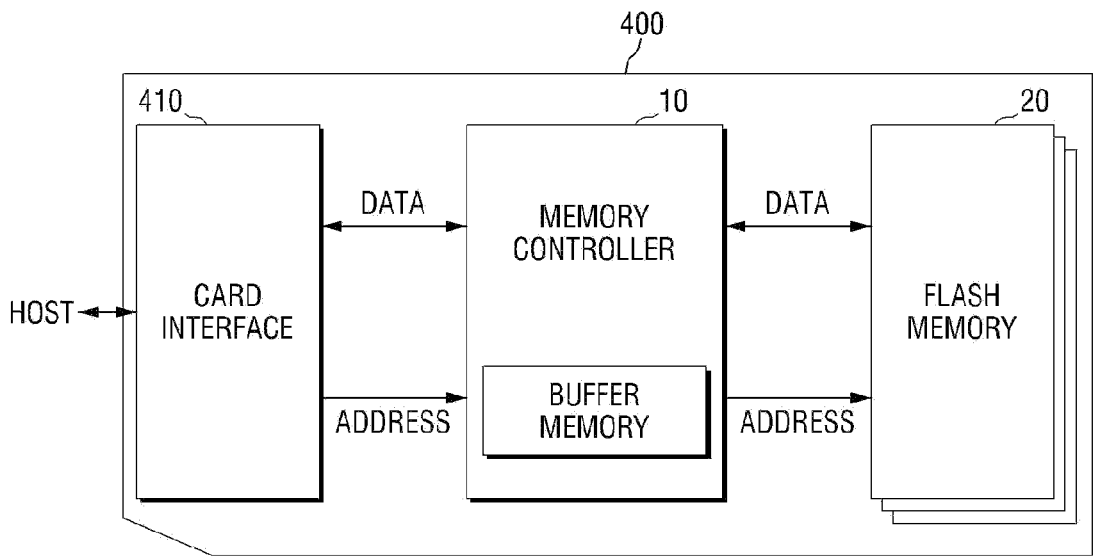
FIG. 14 is a block diagram of an electronic device including a nonvolatile memory device according to at least one example embodiment.

FIG. 14 is a block diagram of an electronic device including a nonvolatile memory device according to at least one example embodiment.

Referring to FIG. 14, the electronic device 400 may include a card interface 410, a memory controller 10, and a nonvolatile memory device 20, e.g., a flash memory device.

The electronic device 400 may perform data communication with a host through the card interface 410. In some embodiments, the card interface 410 may be an SD card interface or an MMC interface, but not limited thereto. The card interface 410 may perform data communication between the host and the memory controller 10 in accordance with a communication protocol of the host capable of communicating with the electronic device 400.

The memory controller 10 performs similar functions as those of the memory controller 10 shown in FIG. 8. In addition, the memory controller 10 controls the overall operation of the electronic device 400. In addition, the memory controller 10 controls data exchange between the card interface 410 and the nonvolatile memory device 20.

A buffer memory 14 included in the memory controller 10 may store various kinds of data for controlling the overall operation of the electronic device 400. The memory controller 20 may be connected to the card interface 410 and the nonvolatile memory 20 through a data bus DATA and an address bus ADDRESS.

In addition, the memory controller 10 may receive or transmit read data or write data through the data bus DATA connected to the card interface 410 or the nonvolatile memory 20.

When the electronic device 400 shown in FIG. 14 is connected to a host such as a personal computer (PC), a tablet PC, a digital camera, a digital audio player, a cellular phone, a console video game hardware, or a digital set top box, the host may transmit or receive data stored in the nonvolatile memory 20 through the card interface 410 or the memory controller 10.

Figure 15:
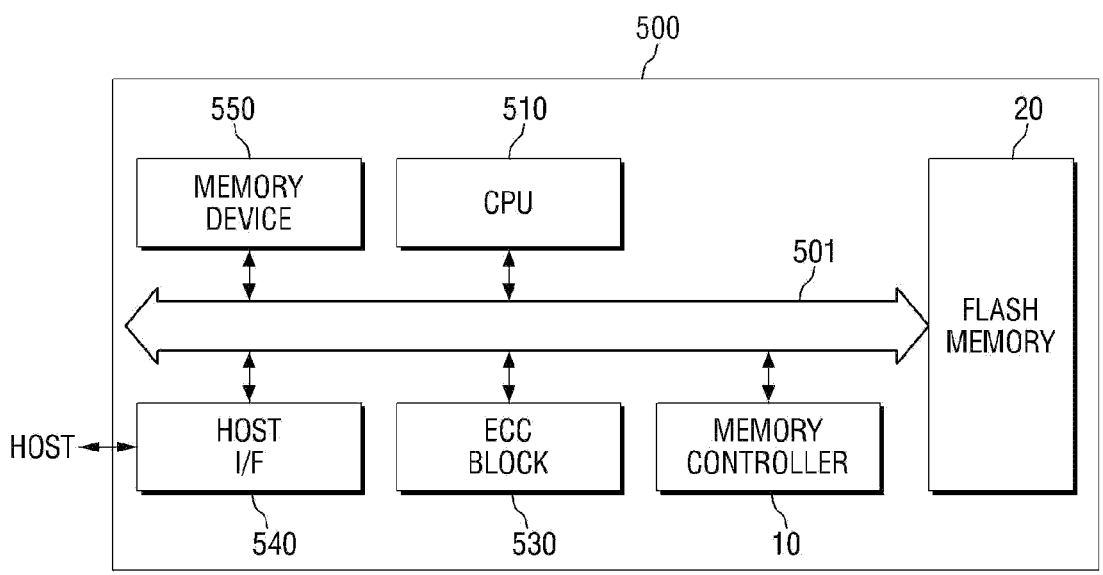
FIG. 15 is a block diagram of an electronic device including a nonvolatile memory device according to at least one example embodiment.

FIG. 15 is a block diagram of an electronic device including a nonvolatile memory device according to at least one example embodiment.

Referring to FIG. 15, the electronic device 500 may include a nonvolatile memory device 20 such as a flash memory device, a memory controller 10 that controls the operation of the nonvolatile memory device 20, and a central processor unit (CPU) 510 capable of controlling the overall operation of the electronic device 500.

The electronic device 500 may include a memory 550 used as an operation memory of the CPU 510. The memory 550 may be implemented as a nonvolatile memory such as ROM or a volatile memory such as DRAM.

A host connected to the electronic device 500 may transmit or receive data to/from the nonvolatile memory device 20 through the memory controller 550 or a host interface 540. Here, the memory controller 550 may perform a function as a memory interface, e.g., a flash memory interface. The memory controller 10 may perform similar functions to those of the memory controller shown in FIG. 8. In some embodiments, the electronic device 500 may further include an ECC block 530. The ECC block 530 operating under the control of the CPU 510 may detect and correct error bits included in the data read from the nonvolatile memory device 20 through the memory controller 10.

The CPU 510 may control data exchange between each of the memory controller 550, the ECC block 530, the host interface 540, and the memory 550 through a bus 501.

The electronic device 500 may be implemented by a universal serial bus (USB)) memory drive or memory stick.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of operating a memory controller, comprising:
    reading, as first data, data stored in a nonvolatile memory do vice using a first read voltage, the first data including an uncorrectable error bit;
    reading, as second data, the data stored in the nonvolatile memory device using a second read voltage different from the first read voltage, the second data including a correctable error bit; and reprogramming the stored data in the nonvolatile memory device based on a comparison result of the first read voltage and the second read voltage, wherein the first data is stored in a first block including a first page corresponding to a first page address Of the nonvolatile memory device, the second data is stored in a second block including a second page corresponding to a second page address of the nonvolatile memory device, and the first page address and the second page address are a same page address.

2. The method of claim 1, wherein t le second read voltage is smaller than the first read voltage.

3. The method of claim 1, wherein the reprogramming comprises reprogramming the nonvolatile memory device when a difference between the first read voltage and the second read voltage is greater than a reference value.

4. The method of claim 1, wherein the reprogramming comprises reprogramming the first page.

5. The method of claim 1, wherein the reprogramming comprises reprogramming the first block.

6. The method of claim 1, wherein the nonvolatile memory device further comprises a third block having a same number of erase operations with that of the first block, and the reprogramming comprises reprogramming the first block and the third block.

7. The method of claim 1, wherein the nonvolatile memory device further comprises a fourth block having a same number of erase operations with that of the first block, and the reprogramming comprises reprogramming the first block and the fourth block.

8. The method of claim 1, wherein consecutive data is consecutively stored in the first block and at least one fifth block, and the reprogramming comprises reprogramming the first. block and the at least one fifth block.

9. The method of claim 1, further comprising:
determining the comparison result by performing a comparison operation, the comparison operation being based on the first read voltage, the second read voltage, and a reference value, the comparison result indicating whether a difference between the first read voltage and the second read voltage exceeds the reference value,
wherein the reprogramming includes reprogramming the stored data in the nonvolatile memory device when the comparison result indicates the difference exceeds the reference value.

* * * * *